United States Patent [19]

Shumaker et al.

[11] Patent Number: 5,402,319

[45] Date of Patent: Mar. 28, 1995

[54] AVIONICS LINE REPLACEABLE UNIT WITH FRAMELESS SPRING RAMP CIRCUIT CARD RETAINER

[75] Inventors: James B. Shumaker; Gary W. Sampson, both of Cedar Rapids, Iowa

[73] Assignee: Rockwell International Corporation, Seal Beach, Calif.

[21] Appl. No.: 52,011

[22] Filed: Apr. 22, 1993

[51] Int. Cl.⁶ ..................... H05K 7/14; A47G 19/08; H01R 13/52; H01R 13/64

[52] U.S. Cl. ................................. 361/796; 361/802; 361/756; 211/41; 439/64; 439/282; 439/370; 439/377

[58] Field of Search ............ 439/282, 370, 377, 59-62, 439/64; 211/41; 361/752, 756, 730, 796, 797, 798, 799-802, 754, 759, 732; 174/52.1

[56] References Cited

U.S. PATENT DOCUMENTS

| | | | |
|---|---|---|---|
| 3,231,785 | 1/1966 | Calabro | 361/797 |
| 4,022,326 | 5/1977 | Marconi | 211/41 |
| 4,484,381 | 11/1984 | Ellis et al. | 211/41 |
| 4,614,389 | 9/1986 | Albert et al. | |
| 4,818,240 | 4/1989 | Karner | 439/377 |
| 5,055,061 | 10/1991 | Lichtenwalter | 439/377 |

*Primary Examiner*—Bot Ledynh
*Attorney, Agent, or Firm*—Gregory G. Williams; M. Lee Murrah; H. Fredrick Hamann

[57] ABSTRACT

An avionics line replaceable unit (LRU), of the type having numerous electronic circuit cards disposed therein in a parallel fashion. The cards being securely held in place when the cover of the LRU is screwed on thereby actuating a spring which transfers force to the circuit cards.

6 Claims, 7 Drawing Sheets

AVIONICS LINE REPLACEABLE UNIT WITH FRAMELESS SPRING RAMP CIRCUIT CARD RETAINER

FIELD OF THE INVENTION

The present invention generally relates to commercial jet airliners and more specifically concerns the electronic systems of such commercial jet airliners, and even more particularly concerns improved apparatus for connecting and retaining various electronic circuit cards within a single line replaceable unit on-board a commercial jet airliner.

BACKGROUND OF THE INVENTION

A typical commercial jet airliner will have numerous electronic devices and instruments or line replaceable units (LRUs) on-board to assist the pilot and crew in operating and navigating an aircraft and additionally to provide services to the many passengers. These instruments frequently need to be modified, repaired or upgraded. These LRUs typically contain therein numerous individual electronic circuit cards which are typically slid into the LRU and electronically and mechanically coupled to the LRU chassis at the LRU bottom and top or the LRU back end. A repair or modification may require the removal and replacement of the entire LRU, however, in some circumstances all that is necessary is to repair or exchange a single circuit card within the LRU. Consequently there is a desire to have the electronic circuit cards be readily removable and replaceable within the LRU.

In the past, commercial jet airliners have used LRU's with numerous different types of electronic circuit card retention schemes therein. One example of prior art schemes is to use a circuit card with a screw adjusted sliding wedge clamp disposed on each side of the circuit card, so that, the card can be inserted into the LRU and then a screw manipulates the sliding wedges along the card sides thereby retaining the cards securely in place.

While this system has gained widespread acceptance in the commercial jet aircraft industry, it has numerous serious drawbacks. First of all, the sliding wedge clamp, of the prior art, typically extends the entire length of the side of the circuit card and consequently severely restricts the much desirable air flow across the circuit cards and additionally adds considerable weight to each circuit card. Secondly, the spring adjusted sliding wedge clamp of the prior art requires that each wedge clamp be manually tightened in order to perform its retention functions. This manual tightening of the screws requires additional time in the repair or modification process. Thirdly, the sliding wedge clamp apparatus of the present invention does not provide any indicators, external to the LRU, which would indicate that the circuit cards have been properly inserted and tightened.

Consequently, there exists a need for improvement of the line replaceable units of commercial jet airliners.

SUMMARY OF THE INVENTION

It is an object of the present invention to reduce the weight of the electronic circuit cards which are placed in line replaceable units on board commercial jet aircraft.

It is a feature of the present invention to include a frameless spring ramp disposed along the edge of the LRU chassis for retaining the circuit cards.

It is an advantage of the present invention to eliminate the need for the heavy sliding wedge clamps of the prior art.

It is another object of the present invention to provide for increased air flow across the electronic circuit cards when they are disposed within an LRU.

It is another feature of the present invention to utilize a thin spring ramp for providing retention of the electronic circuit card.

It is another advantage of the present invention to eliminate the air flow restrictions caused by the typical sliding wedge clamp apparatus found on each edge of a typical prior art circuit board.

It is yet another object of the present invention to provide increased reliability of line replaceable units for commercial jet aircraft.

It is yet another feature of the present invention to include a top cover actuated circuit card retention spring disposed along the sides of the LRU chassis.

It is yet another advantage of the present invention to provide a readily visible indicator that the circuit cards disposed within an LRU are properly secured.

It is still another object of the present invention to provide an LRU with reduced labor requirements for exchanging circuit cards therein.

It is still another feature of the present invention to provide for actuation of the spring ramp by screwing down the top cover of the LRU.

It is still another advantage of the present invention to eliminate the need for individually adjusting the sliding wedge clamps of the prior art.

The present invention provides an enhanced aircraft LRU system, which is designed to satisfy the aforementioned needs, produce the earlier mentioned objects, contain the above described features and achieve the previously stated advantages. The invention is carried out in a "sliding wedge clamp-less" system in a sense that the typical sliding wedge clamps disposed on opposite ends of the circuit card have been eliminated. Instead, a top actuated frameless thin spring ramp is disposed along two sides of the LRU with the spring ramp retaining the circuit card securely within the LRU when the top cover of the LRU is screwed down and actuates the spring ramp.

Accordingly, the present invention relates to an improved aircraft line replaceable unit, which includes an electronic circuit card retaining spring disposed within the LRU and a top cover which actuates the spring and securely retains the electronic circuit card when the top cover is secured to the LRU.

BRIEF DESCRIPTION OF THE DRAWINGS

The invention may be more fully understood by reading the following detailed description in conjunction with the appended drawings; wherein.

DETAILED DESCRIPTION

Figure 1:
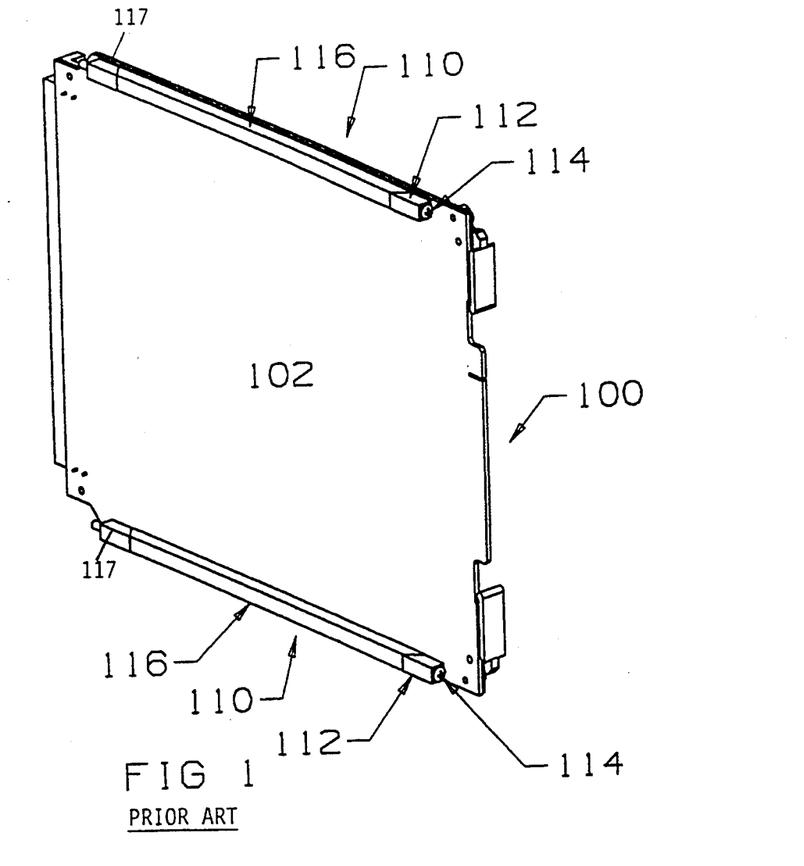
FIG. 1 is a perspective view of a typical electronic circuit card, of the prior art, having a screw adjustable sliding wedge clamp disposed thereon.

Now referring to the drawings, where like numerals refer to like structure and matter thoughout, and more particularly to FIG. 1, there is shown an electronic circuit card, of the prior art, generally designated 100 which includes a circuit portion 102 therein and sliding wedge clamp assembly, generally designated 110, including a wedge clamp top 112, wedge clamp bottom 117 and adjustment screw 114 and a wedge clamp body 116. The overall thickness of the wedge clamp assembly 110 is increased when screw 114 is advanced or tightened which causes the top 112 and bottom 117 to slide along the body 116 and thereby creating an overall increased thickness of the wedge clamp assembly 110.

Figure 2:
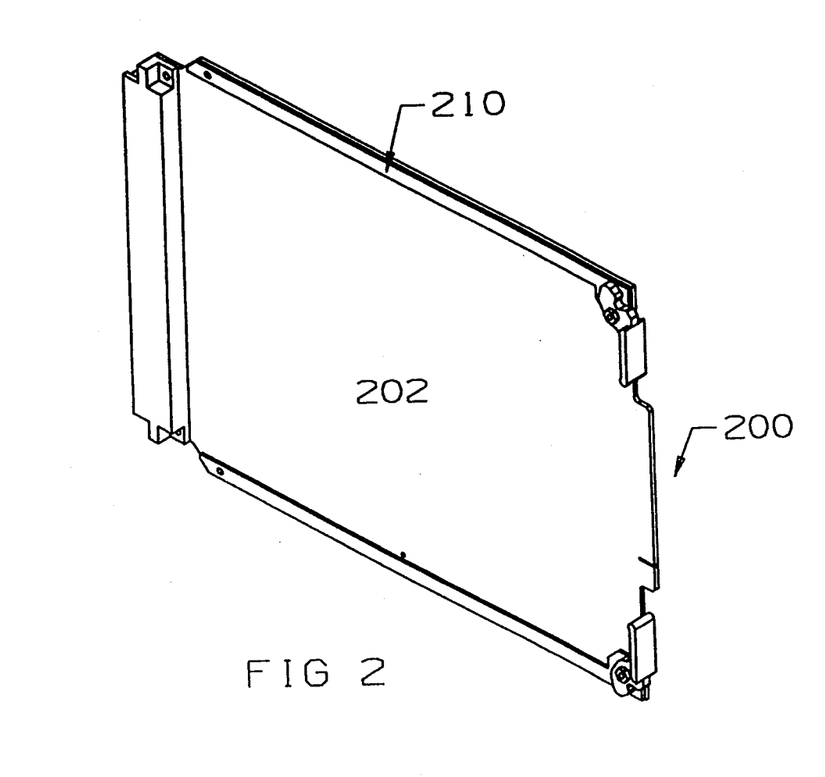
FIG. 2 is a perspective view of an electronic circuit card, of the present invention, with the sliding wedge clamp removed.

Now referring to FIG. 2, there is shown a perspective view of a electronic circuit card, of the present invention, generally designated 200, viewed from the opposite side from FIG. 1 having a circuit area 202 therein and further showing disposed along a first edge a solid strip 210 which is also present in the prior art, and further shows no sliding wedge assembly 110, of the prior art of FIG. 1.

Figure 3:
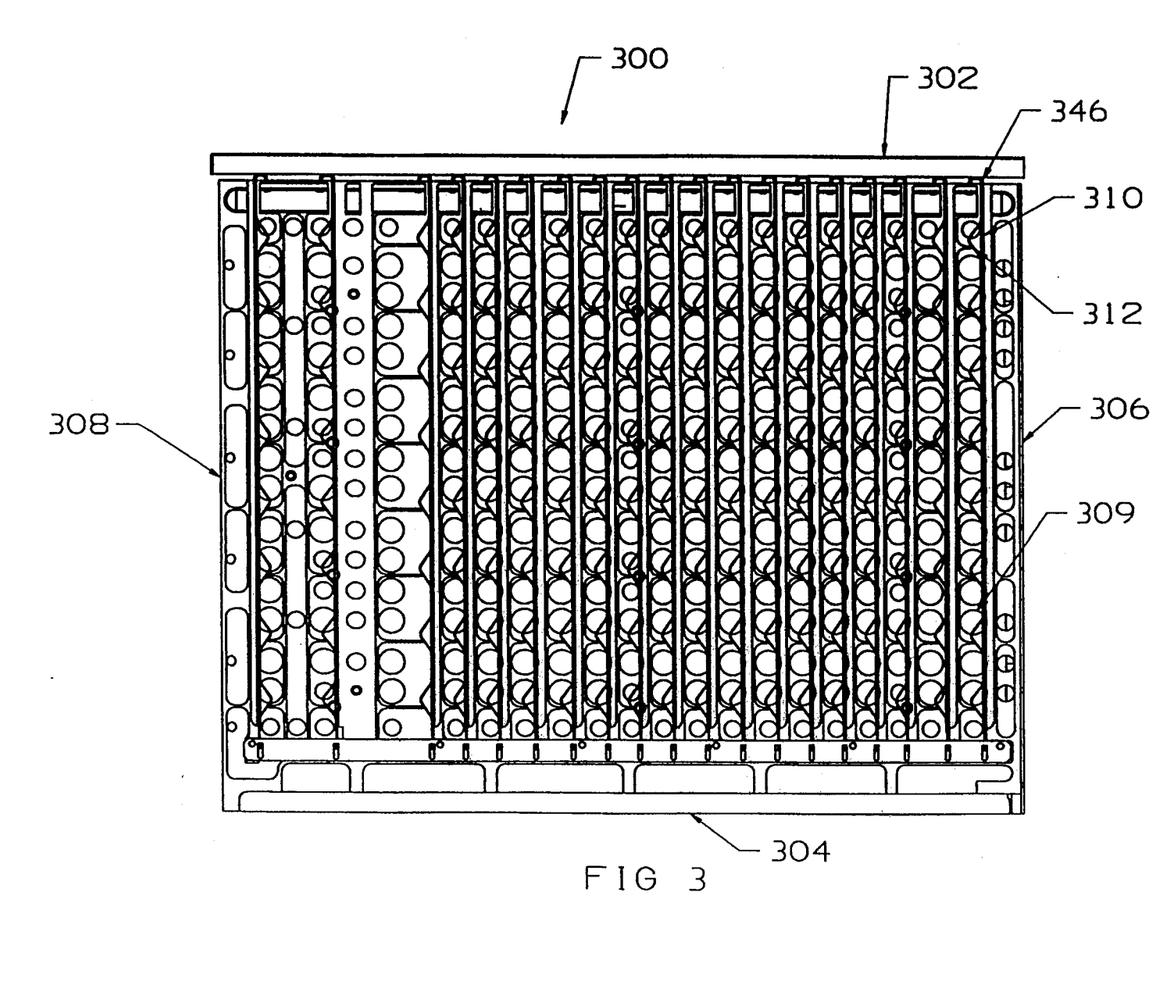
FIG. 3 is a top view of the LRU of the present invention, without any circuit cards disposed therein, which shows the thin spring ramps of the present invention.

Now referring to FIG. 3, there is shown a top view of the LRU, of the present invention, generally designated 300, having an insertion side 302, an end 304, a front side 306 and a back side 308. Also shown disposed over the openings 309 is back-up plate 310 and spring ramp 312. Shown disposed extending through insertion side 302 and coupled with back-up plate 310 are cover receiving actuators 346. The spring ramp 312 is preferably chemically etched from a thin sheet of beryllium copper. However, any material may be substituted that has suitable strength and heat conduction properties. The wave shape is formed at each location and the part is then heat treated to increase tensile strength and preferably has dimensions determined by the size requirements for the circuit card, the spacing between adjacent circuit cards, tolerance of the circuit card thickness, chassis locational tolerance of contact protrusion on chassis and the load or force requirement. Back-up plate 310 and cover receiving actuators 346 are preferably made from one piece of thin aluminum sheet punched into shape required. The spring ramp 312 and backing plate 310 are then preferrably riveted together to make a assembly.

Figure 4:
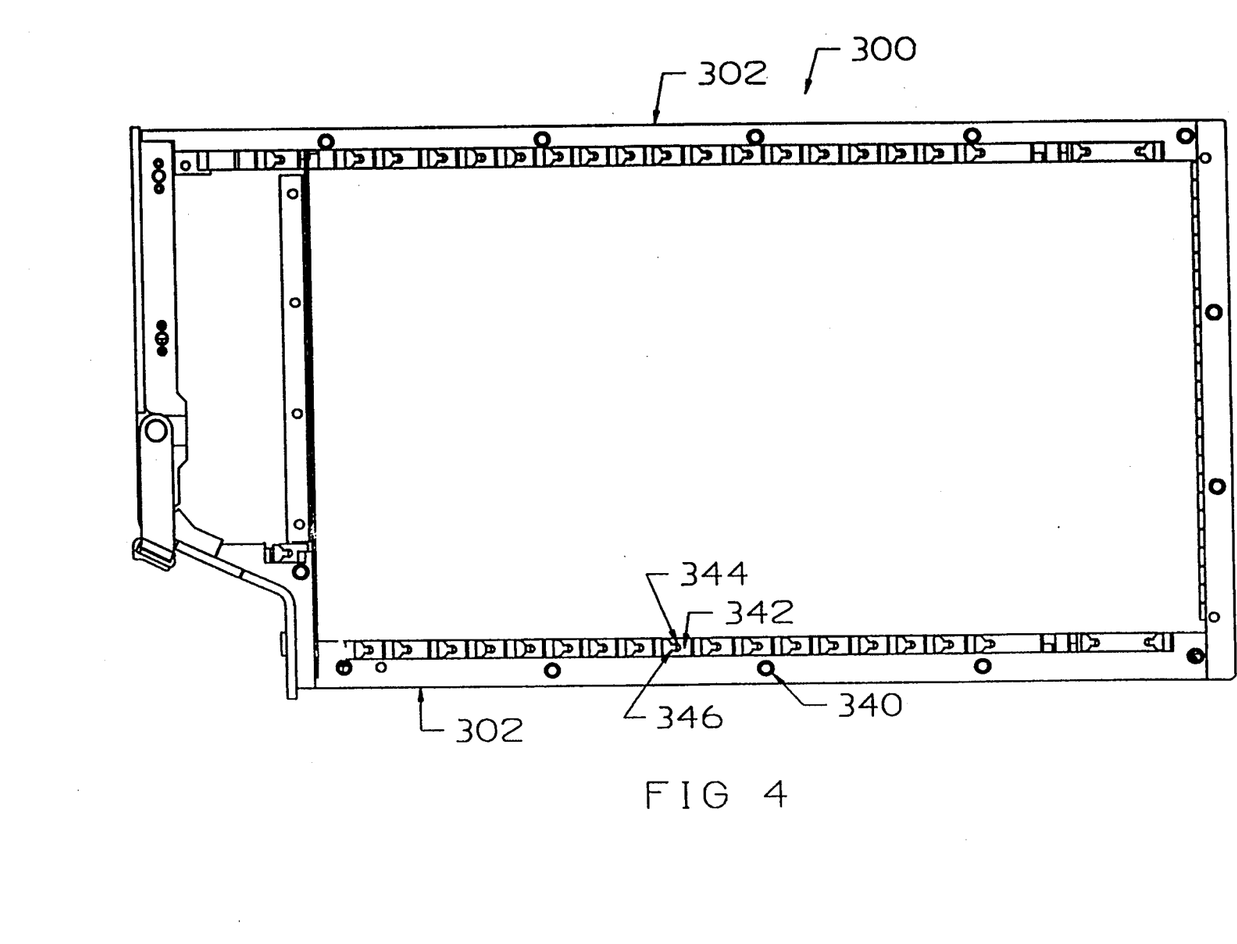
FIG. 4 is a side view of the LRU, of the present invention, without any circuit cards disposed therein, which shows the cover end of the spring ramp of the present invention.

Now referring to FIG. 4, there is shown an insertion side view, of the LRU, of the present invention, generally designated 300, showing the insertion side 302 and a plurality of screw holes 340 disposed therein for receiving screws which would extend through the cover "not shown". Also shown in FIG. 4 are chassis blocks 342 which are coupled to insertion side 302 and having holes 344 extending therethrough. Disposed in holes 344 are cover receiving actuators 346. Chassis blocks 342 are spaced apart to form a plurality of slots for receiving circuit cards 200.

Figure 5:
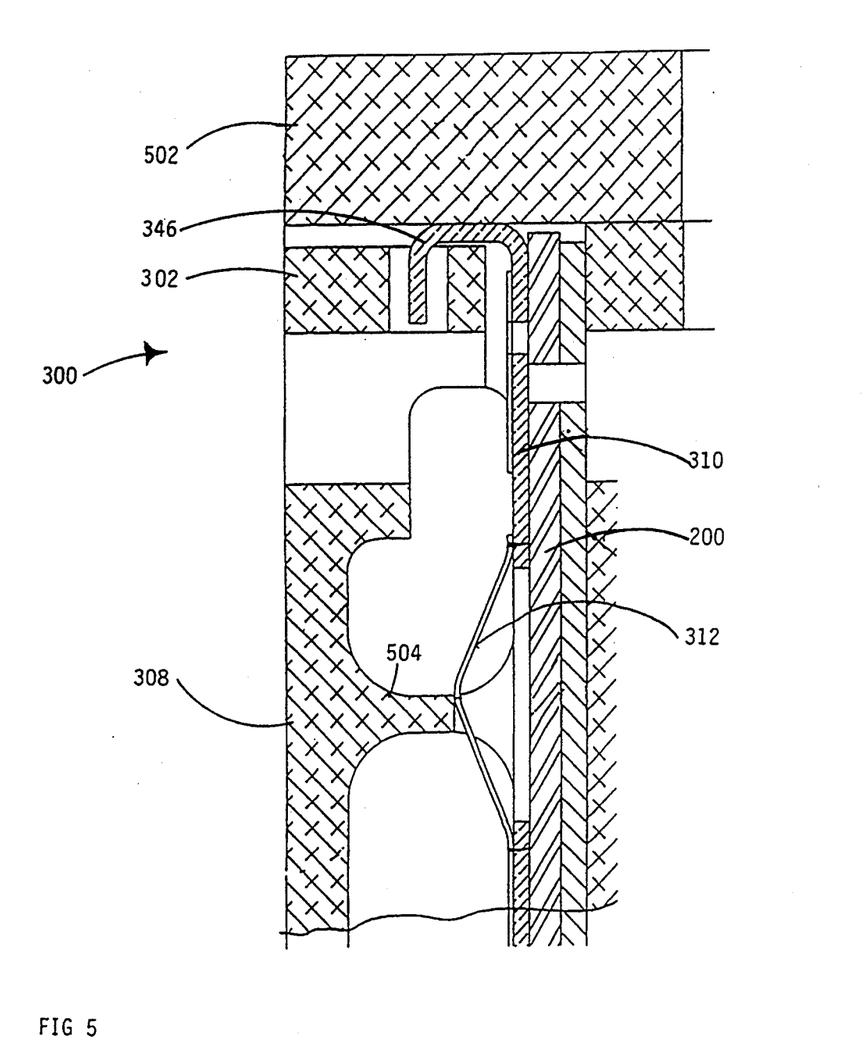
FIG. 5 is a cross sectional view of the LRU, of the present invention, showing the cover in place and actuating the spring ramp.

Now referring to FIG. 5, there is shown the LRU, of the present invention, generally designated 300 having a cover 502 disposed thereon. FIG. 5 is a close-up cross sectional view of the LRU 300, with a circuit board 200 disposed therein. The cover 502 is shown depressing the covering receiving actuator 346 which causes the spring ramp 312 to contact a protrusion 504 thereby creating a clamping force against and perpendicular to the longitudinal direction of back-up plate 310 thereby securely holding circuit card 200 in place.

Figure 6:
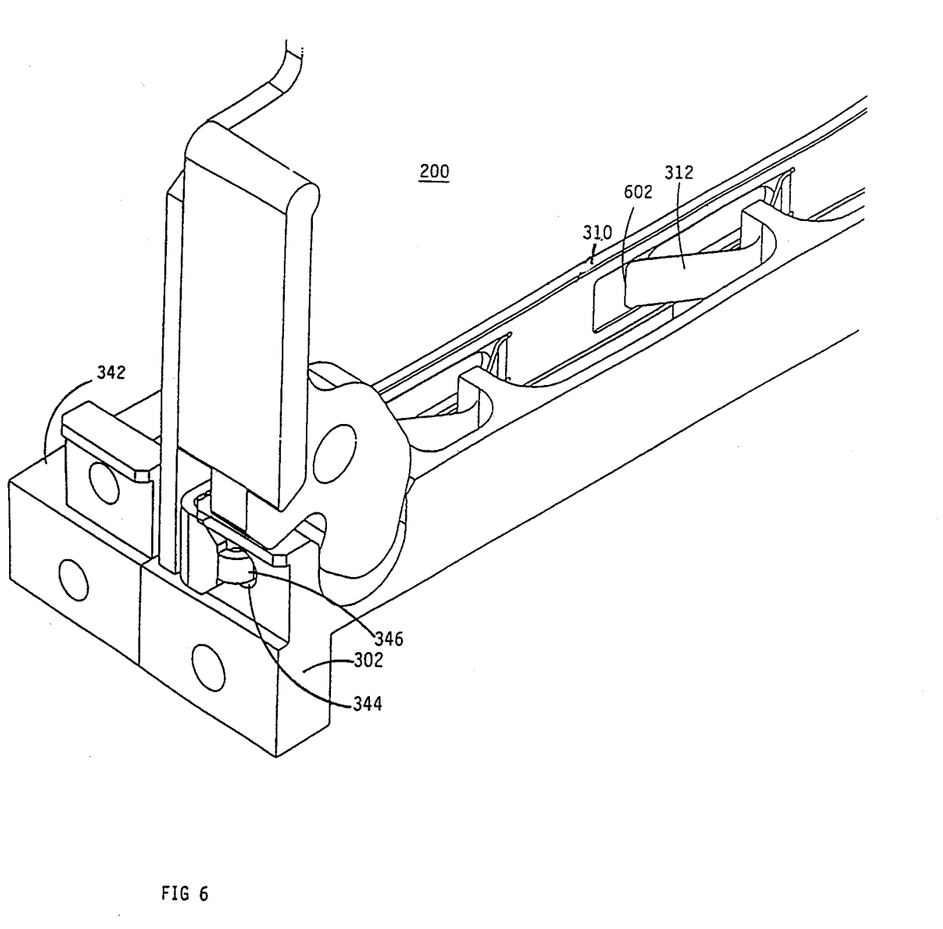
FIG. 6 is a perspective view of a portion of the LRU and electronic circuit card combination, of the present invention which shows the circuit card disposed in the LRU and the spring ramps disposed for retaining the circuit card.

Now referring to FIG. 6, there is shown a close-up view of a portion of the LRU 300 having a circuit card 200 disposed therein which is in contact with back-up plate 310 which is held firmly in place by the clamping force of spring ramp 312. The back-up plate 310 is coupled to the cover receiving actuator 346 which extends from insertion side 302 and curves through hole 344 in chassis block 342. It can be seen that spring ramp 312 is not firmly attached at its sliding end 602 to back-up plate 310. This allows for the spring ramp to be compressed and the sliding end 602 to translate across the back-up plate 310.

Figure 7:
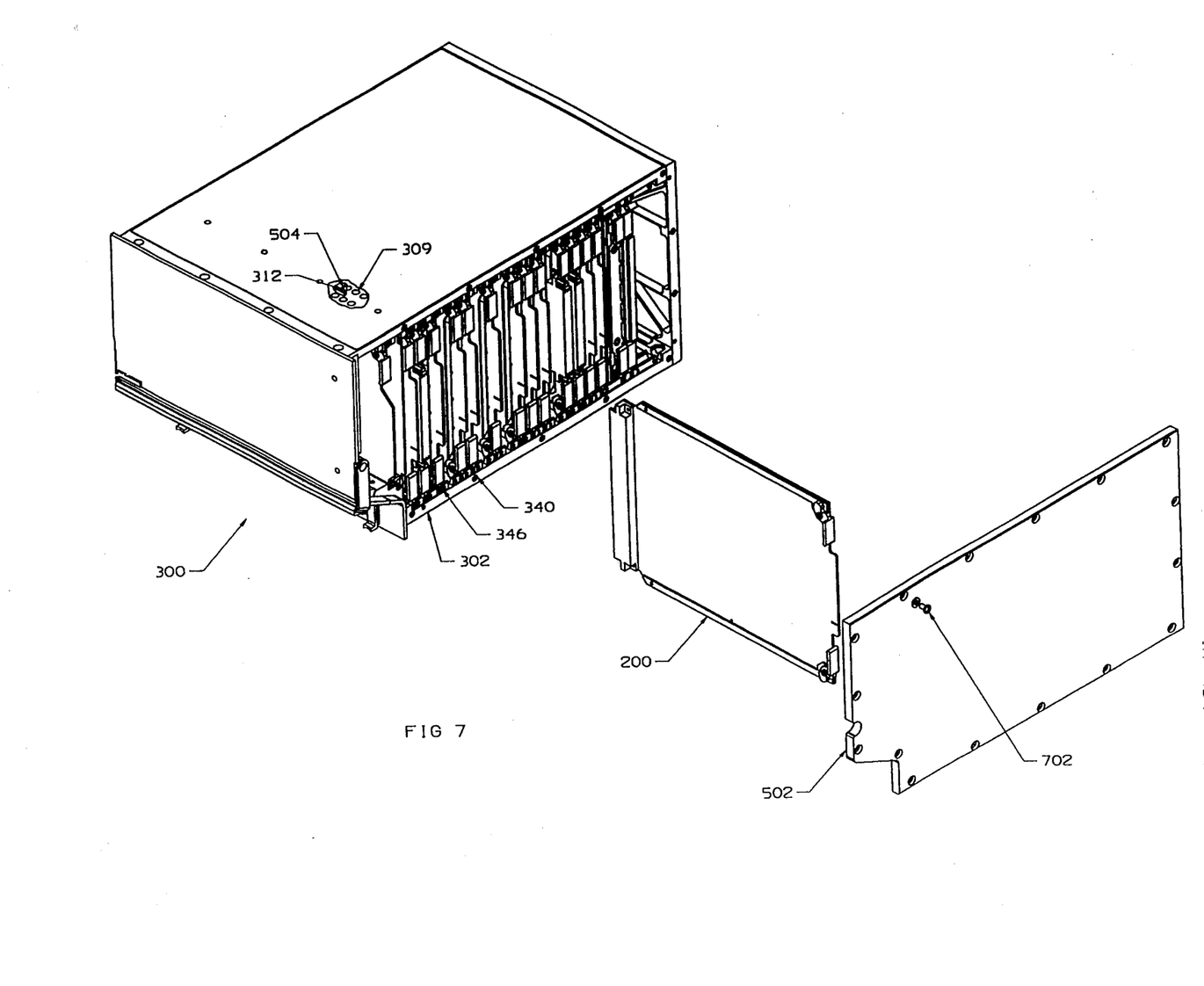
FIG. 7 is a cut away exploded perspective view of the LRU assembly of the present invention, showing the side cover, the electronic circuit cards and the LRU chassis.

Now referring to FIG. 7, there is shown an exploded cut away perspective view of the LRU, of the present invention, generally designated 300, which shows a circuit card 200 to be inserted in LRU 300 at insertion side 302 and further shows cover 502 which is brought in contact with insertion side 302 and depresses cover receiving actuators 346. Cover 502 is firmly attached to insertion side 302 by screws 702 which extend through cover 502 and enter holes 340.

In operation and referring to FIGS. 2–7, the present invention achieves many of its material advantages as follows. A circuit card 200, without bulky heavy and air flow restricting wedge clamps thereon, is inserted into the LRU 300. When the circuit card 200 is disposed in the LRU 300 air flow is permitted through holes 309. When the circuit card 200 is first inserted there is no need to use a wrench or screw driver to tighten any sliding wedge clamps in order to secure the circuit card within the LRU 300. Instead, the cover 502 is placed on the LRU 300 along its insertion side 302 so that the cover 502 contacts each cover receiving actuator 346. When screws 702 are advanced through cover 502 and into screw receiving holes 340 and the cover is consequently firmly adjacent to the insertion side 302, the actuators 346 cause the back-up plate 310 to translate which causes the ramp 312 to contact protrusion 504 which thereby causes a clamping force to be placed against the circuit card 200. The circuit card then is held securely in place with a heat conduction path being provided, without the need for individual adjustment of any wedge clamps. Additionally, the mere fact that the cover 502 is securely in place against insertion side 302 is a positive indication that the circuit cards 200, disposed in LRU 300, are securely in place.

It is thought that the improved avionics LRU system of the present invention and many of its attendant advantages will be understood from the foregoing description, and it will be apparent that various changes may be made in the form, construction and arrangement of the parts thereof without departing from the spirit or scope of the invention, or sacrificing all of its material advantages, the form herein before described being merely preferred or exemplary embodiments thereof.

We claim:

1. An improved avionics cabinet of the type having:
   an end;
   a box top coupled to said end;
   a box bottom, parallel to said box top and coupled to said end;
   a front box side coupled to said end and perpendicular to said box top and said box bottom;
   a back box side parallel to said front box side and perpendicular to said box top and said box bottom and coupled to said end; said back box side having a plurality of back pins therein;
   the end and all of said box sides are configured to create a rectangular box;
   the box further having a removable cover which is parallel with said end; and,
   said box containing a plurality of electronic circuit cards disposed therein in a parallel fashion, each of said electronic circuit cards having a back card side, an opposing front card side, an insertion side, an end side, a top card side, and a bottom card side; where upon insertion of said electronic circuit cards in said box, said top card side and said box top are adjacent and said bottom card side and said box bottom are adjacent, said plurality of electronic circuit cards, each having a pin receiving connector on its end side, said pin receiving connector for mechanically and electrically coupling with said plurality of back pins;
   wherein the improvement comprises:
   a spring member disposed within said box and parallel with said electronic circuit cards; and,
   said spring member being actuated by said removable cover, so that, an installation of said cover on said box causes said spring member to contact said electronic circuit cards.

2. A line replaceable unit comprising:
   a rectangular box having a top and a bottom with ventilating holes therein; said box having a removable cover and said box further having a plurality of slots therein receiving a plurality of electronic circuit cards; at least one cover actuated spring member disposed in said box for each of said plurality of slots; said spring member delivering a circuit card retaining force to said plurality of electronic circuit cards when said removable cover is in contact with said cover actuated spring member.

3. A line replaceable unit of claim 2 wherein said cover actuated spring member protrudes from said at least one box and further contacts said plurality of electronic circuit cards.

4. A line replaceable unit of claim 3 wherein said circuit card retaining force is perpendicular to a force applied to said cover actuated spring member when said removable cover is secured to said box.

5. A line replaceable unit of claim 4 wherein said cover actuated spring member contains an elongated cover actuator and a spring ramp coupled thereto.

6. A line replaceable unit of claim 5 wherein said box further comprises a plurality of protuberances therein for engaging said spring ramp when said elongated cover actuator is translated.

* * * * *